US007110729B1

(12) United States Patent
Dash

(10) Patent No.: US 7,110,729 B1

(45) Date of Patent: Sep. 19, 2006

(54) APPARATUS AND METHOD FOR GENERATING A TEMPERATURE INSENSITIVE REFERENCE CURRENT

(75) Inventor: Ranjit Kumar Dash, Karnataka (IN)

(73) Assignee: National Semiconductor Corporation, Santa Clara, CA (US)

( * ) Notice: Subject to any disclaimer, the term of this patent is extended or adjusted under 35 U.S.C. 154(b) by 630 days.

(21) Appl. No.: 10/348,840

(22) Filed: Jan. 22, 2003

(51) Int. Cl.
*H10Q 11/12* (2006.01)
*G05F 3/08* (2006.01)

(52) U.S. Cl. .............................. 455/127.1; 455/169.1; 455/289; 455/298; 455/299; 323/312

(58) Field of Classification Search ................ 455/967, 455/972–974, 343.1–343.6, 126, 127.1, 127.2, 455/115.1, 572, 573, 575.1, 90.3, 67.11, 94, 455/137, 169.1, 226.1, 232.1, 252.1, 289, 455/298–299, 325, 333; 323/312–315, 907; 327/513

See application file for complete search history.

(56) References Cited

U.S. PATENT DOCUMENTS

| | | | | |
|---|---|---|---|---|
| 4,555,792 | A * | 11/1985 | Van Tol | 375/303 |
| 5,604,427 | A * | 2/1997 | Kimura | 323/313 |
| 5,839,060 | A * | 11/1998 | Kasperkovitz et al. | 455/226.2 |
| 5,848,355 | A * | 12/1998 | Rasor | 455/260 |
| 5,956,627 | A * | 9/1999 | Goos | 455/127.1 |
| 6,087,820 | A | 7/2000 | Houghton et al. | |
| 6,265,857 | B1 * | 7/2001 | Demsky et al. | 323/312 |
| 6,377,825 | B1 * | 4/2002 | Kennedy et al. | 455/569.2 |

* cited by examiner

*Primary Examiner*—Pablo N. Tran

(57) ABSTRACT

A constant current source for generating a constant reference current that is relatively temperature insensitive. The constant current source comprises: i) first circuitry for generating a first output current that increases with increases in temperature; ii) second circuitry for generating a second output current that decreases with increases in temperature; and iii) a current combiner circuit that combines the first and second output currents to thereby generate the constant reference current. A change in the first output current caused by a temperature change is at least partially offset by a change in the second output current caused by the temperature change.

20 Claims, 2 Drawing Sheets

APPARATUS AND METHOD FOR GENERATING A TEMPERATURE INSENSITIVE REFERENCE CURRENT

TECHNICAL FIELD OF THE INVENTION

The present invention is generally directed to current sources for use in integrated circuits, and more specifically, to a reference current generating circuit that is highly stable and temperature insensitive across a defined operating range of supply voltage.

BACKGROUND OF THE INVENTION

There are a myriad number of applications in which an integrated circuit (IC) requires a constant current source (or reference current generator). These applications encompass both digital devices and analog devices. Many constant current sources are based on the principle of creating a constant voltage drop across a fixed on-chip resistor, thereby getting a constant current source. These types of constant current sources are suitable for most of the common application.

However, many applications require high precision and operate under extreme temperature conditions. One typical example is a cell phone, which typically includes high-precision components and must operate in sub-zero temperatures and in 100+ degree temperatures. For these types of applications, a constant current source based on a fixed on-chip resistor cannot be used. This is because the on-chip resistor is temperature sensitive. As the resistance increases with temperature, the current through the on-chip resistor must be reduced in order to maintain a constant voltage across the on-chip resistor. Thus, the supposedly constant current decreases with increasing temperature. This problem is often addressed by adding cooling equipment that maintains the integrated circuit in a narrow operating temperature range, thereby minimizing the variation in the desired constant current.

Therefore, there is a need in the art for improved constant current sources. In particular, there is a need for a reference current generator that is highly temperature insensitive across a relatively wide range of operating temperatures.

SUMMARY OF THE INVENTION

The present invention overcomes the problems inherent in the prior art by generating a constant current that is highly temperature-insensitive and very stable across a relatively wide operating range of supply voltages. The present invention has the advantage that process variations have only a very minimum effect on the temperature-insensitiveness of the constant current source. This is achieved by combining a positive temperature coefficient dependent current with a negative temperature coefficient dependent current in correct proportions to get a desired constant output current.

To address the above-discussed deficiencies of the prior art, it is a primary object of the present invention to provide a constant current source for generating a constant reference current that is relatively temperature insensitive. According to an advantageous embodiment of the present invention, the constant current source comprises: i) first circuitry for generating a first output current that increases with increases in temperature; ii) second circuitry for generating a second output current that decreases with increases in temperature; and iii) a current combiner circuit that combines the first and second output currents to thereby generate the constant reference current, wherein a change in the first output current caused by a temperature change is at least partially offset by a change in the second output current caused by the temperature change.

According to one embodiment of the present invention, the first circuitry comprises a first reference current generator for generating a first reference current that increases with increases in temperature.

According to another embodiment of the present invention, the first circuitry further comprises a first current mirror circuit capable of multiplying the first reference current by a factor m to thereby generate the first output current that increases with increases in temperature.

According to still another embodiment of the present invention, the second circuitry comprises a second reference current generator for generating a second reference current that decreases with increases in temperature.

According to yet another embodiment of the present invention, the second circuitry further comprises a second current mirror circuit capable of multiplying the second reference current by a factor n to thereby generate the second output current that decreases with increases in temperature.

According to a further embodiment of the present invention, the factor m and the factor n are determined based on the relative proportions of the first and second reference currents.

According to a still further embodiment of the present invention, the factor m and the factor n are selected according to the relative proportions of the first and second reference currents required to negate the temperature dependency of the constant reference current.

According to a yet further embodiment of the present invention, the first and second current mirror circuits comprise P-channel transistors.

Before undertaking the DETAILED DESCRIPTION OF THE INVENTION below, it may be advantageous to set forth definitions of certain words and phrases used throughout this patent document: the terms “include” and “comprise,” as well as derivatives thereof, mean inclusion without limitation; the term “or,” is inclusive, meaning and/or; the phrases “associated with” and “associated therewith,” as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term “controller” means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged electronic device that requires a stable, temperature-insensitive constant current source.

Figure 1:
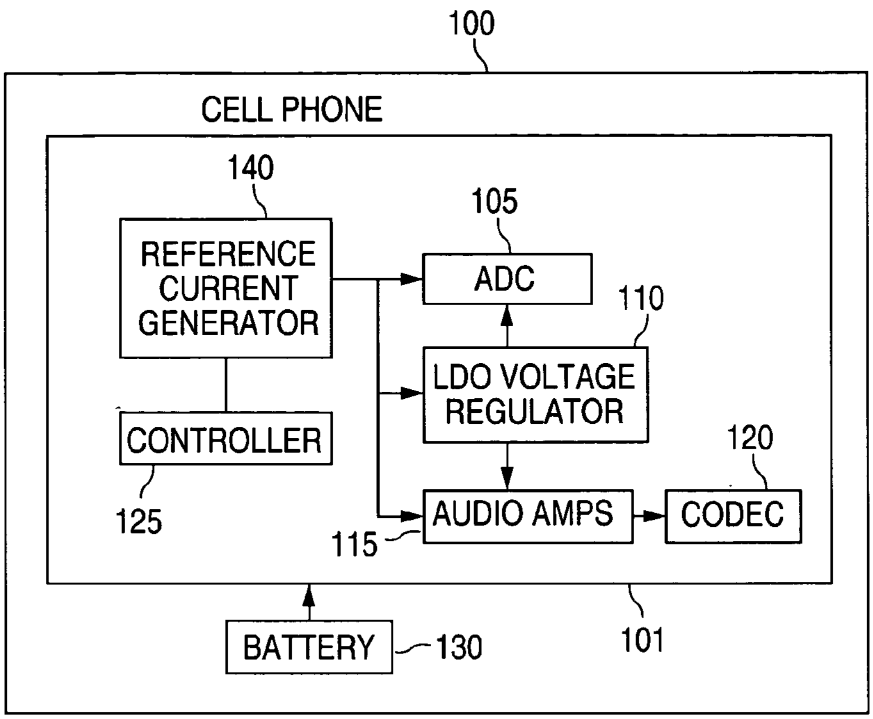
FIG. 1 illustrates a cellular telephone containing a reference current generator according to the principles of the present invention.

FIG. 1 illustrates cellular telephone 100, which contains reference current generator 140 according to the principles of the present invention. Cellular telephone 100 contains printed circuit board (PCB) 101, which comprises analog-to-digital converter (ADC) 105, low-drop-out (LDO) voltage regulator 110, audio amplifiers 115, codec 120, controller 125, battery 130, and reference current generator 140. Reference current generator 140 provides a highly stable, temperature-insensitive constant reference current for one or more of ADC 105, LDO voltage regulator 110, audio amplifiers 115 and codec 120, among other circuits.

According to an exemplary embodiment of the present invention, controller 130 of cellular telephone 100 is capable of conserving power and prolonging the operating life of battery 120 by periodically shutting down reference current generator 140, and many of the other electrical circuits in cellular telephone 100. According to an exemplary embodiment of the present invention, reference current generator 140 may be a part of a band-gap reference circuit (or similar circuit) that also provides a constant reference voltage to ADC 105, LDO voltage regulator 110, audio amplifiers 115 and codec 120, among other circuits.

In the embodiment shown in FIG. 1, reference current generator 140 is disposed in a cell phone. However, this is by way of illustration only and should not be construed so as to limit the scope of the present invention. Those skilled in the art will recognize that reference current generator 140 or a similar constant current generator according to the principles of the present invention may be implemented in a myriad number of integrated circuit applications.

Figure 2:
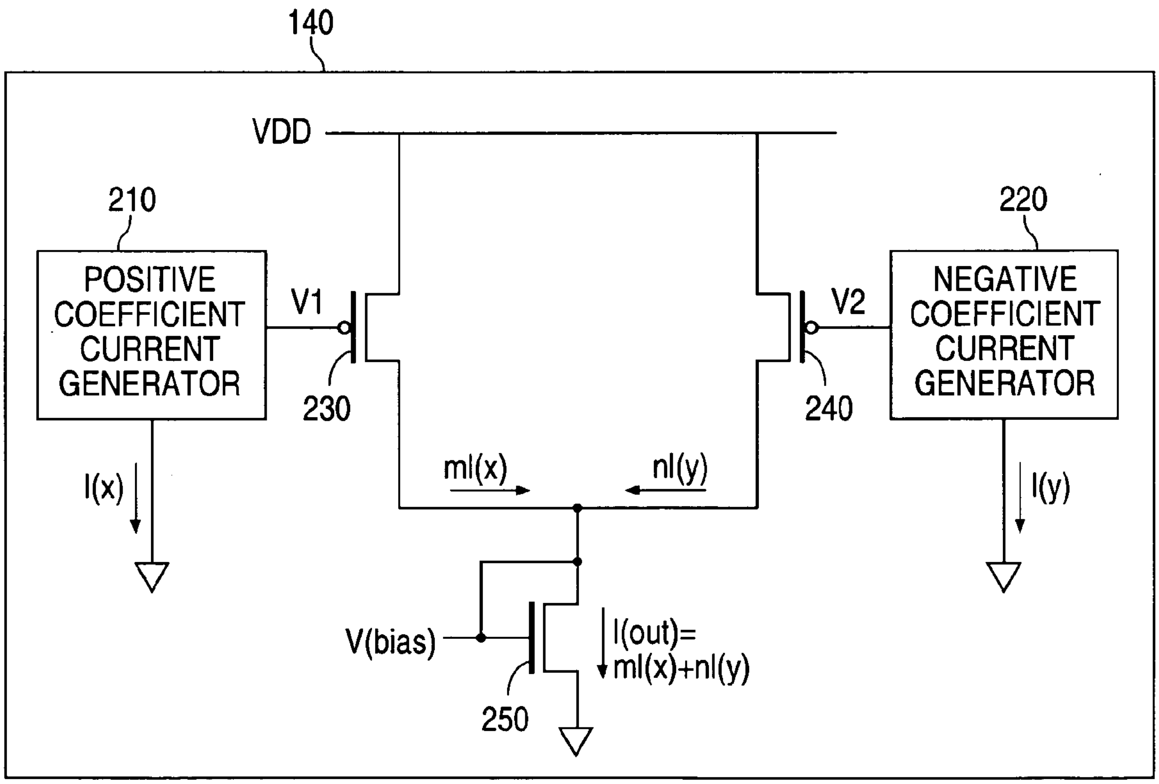
FIG. 2 illustrates the reference current generator in FIG. 1 in greater detail according to an exemplary embodiment of the present invention.

FIG. 2 illustrates selected portions of reference current generator 140 in greater detail according to an exemplary embodiment of the present invention. Reference current generator 140 comprises positive coefficient current generator 210, negative coefficient current generator 220, P-channel transistor 230, P-channel transistor 240, and N-channel transistor 250. The gate of N-channel transistor 250 is controlled by the biasing voltage, V(bias). The purpose of reference current generator 140 is to generate an output current, I(out), that is very stable with respect to temperature variations from about −40° C. to about 120° C. and also over a significant supply voltage range. The present invention minimizes the process dependency so that technology transfer between processes becomes less complicated.

According to the principles of the present invention, positive coefficient current generator 210 generates a first reference current, I(x), that increases with respect to increases in temperature and negative coefficient current generator 220 generates a second reference current, I(y), that decreases with respect to increasing temperature. The current I(x) is mirrored by P-channel transistor 230 as the current mI(x), where the scaling factor m is determined by the width (W) and length (L) dimensions of P-channel transistor 230. The current I(y) is mirrored by P-channel transistor 240 as the current nI(y), where the scaling factor n is determined by the width (W) and length (L) dimensions of P-channel transistor 240. Since the current mI(x) mirrors the first reference current, I(x), the current mI(x) also increases with temperature increases. Since the current nI(y) mirrors the second reference current, I(y), the current nI(y) also decreases with temperature increases.

Finally, N-channel transistor 250 combines the current mI(x) and the current nI(y) to form the output current, I(out). As temperature increases, the increase in the current mI(x) is offset by the decrease in the current nI(y), so that I(out), the drain current in N-channel transistor 250, remains constant. The currents I(x) and I(y) are added in the correct proportions to cancel out any temperature dependency. When the currents mI(x) and nI(y) are generated on the same integrated circuit (IC), this also ensures that the currents mI(x) and nI(y) are independent of the supply. Therefore, the output current, I(out), is also supply independent. The biasing voltage, V(bias) can be used as the gate biasing voltage for all of the N-channel transistors anywhere on the IC chip to reflect the required amount of current.

Figure 3:
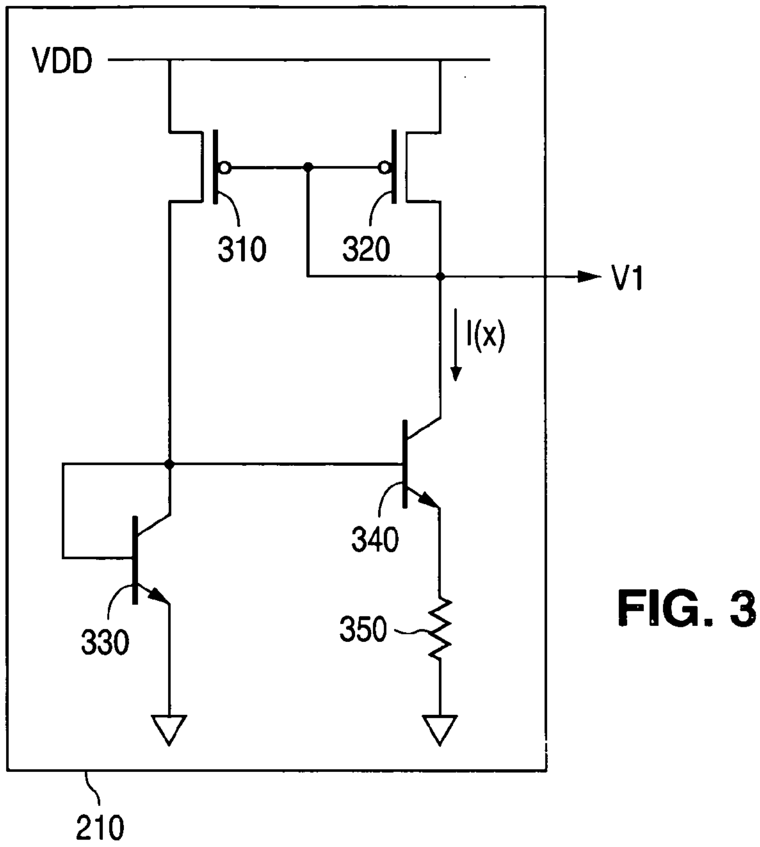
FIG. 3 illustrates the positive temperature coefficient current generator in the reference current generator in greater detail according to an exemplary embodiment of the present invention.

FIG. 3 illustrates selected portions of positive temperature coefficient current generator 210 in reference current generator 140 in greater detail according to an exemplary embodiment of the present invention. Positive temperature coefficient current generator 210 comprises P-channel transistor 310, P-channel transistor 320, n-p-n bias-junction transistor 330, n-p-n bias junction transistor 340 and resistor 350. According to an exemplary embodiment of the present invention, transistor 340 has a size (A1) that is ten times larger than the size (A2) of transistor 330 (i.e., A1=10A2).

Positive temperature coefficient current generator 210 is a conventional proportional-to-absolute-temperature (PTAT) current generator that generates a current, I(x), that has a linearly increasing dependency on the absolute temperature. P-channel transistors 310 and 320 form a current mirror. The gates of transistors 310 and 320 are coupled together and the sources of transistors 310 and 320 are coupled to the VDD power supply, so that the gate-to-source voltage (Vgs) for transistor 310 is identical to the gate-to-source voltage for transistor 320. Since Vgs is the same for transistors 310 and 320, the drain currents are the same for transistors 310 and transistor 320. The gate voltage, V1, of transistors 310 and 320 is an output that is used to generate the mirror current mI(x) in N-channel transistor 230.

The identical currents from transistors 310 and 320 ensure that the collector currents of bias-junction transistors 330 and 340 are also identical. In a preferred embodiment of the present invention, a cascode mirror arrangement of transistors may be used to minimize the effect of supply variation.

The collector current, I(x) of transistor 340 is given by:

$$I(x) = (V_T / R350)\ln(A2/A1);$$
$$= (kT/gR350)\ln(10);$$
$$= (C1)T/R350,$$

where R350 is the resistance value of resistor 350 and C1 is a constant equal to (kln10/q). For all practical purposes, I1 may be considered to be proportional to absolute temperature.

Figure 4:
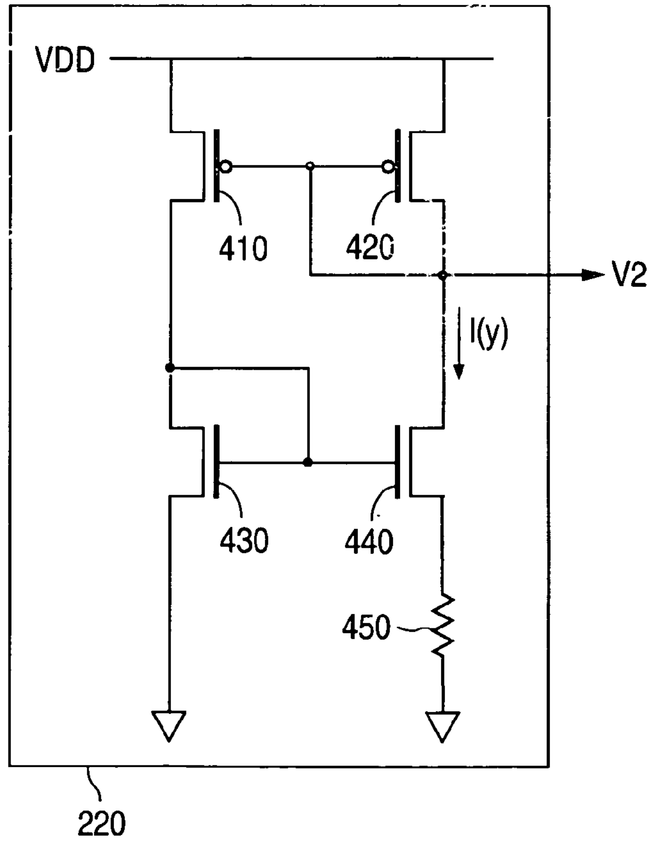
FIG. 4 illustrates the negative temperature coefficient current generator in the reference current generator in greater detail according to an exemplary embodiment of the present invention.

FIG. 4 illustrates selected portions of negative temperature coefficient current generator 220 in reference current generator 140 in greater detail according to an exemplary embodiment of the present invention. Negative temperature coefficient current generator 220 comprises P-channel transistor 410, P-channel transistor 420, N-channel transistor 430, N-channel transistor 440, and resistor 450. According to an exemplary embodiment of the present invention, transistor 440 has a W/L ratio that is z times larger than the W/L ratio of transistor 430.

Negative temperature coefficient current generator 220 generates a current, I(y), that has an approximately linearly decreasing dependency on the absolute temperature. P-channel transistors 410 and 420 form a current mirror. The gates of transistors 410 and 420 are coupled together and the sources of transistors 410 and 420 are coupled to the VDD power supply, so that the gate-to-source voltage (Vgs) for transistor 410 is identical to the gate-to-source voltage for transistor 420. Since Vgs is the same for transistors 410 and 420, the drain currents are the same for transistors 410 and transistor 420. The gate voltage, V2, of transistors 410 and 420 is an output that is used to generate the mirror current nI(y) in N-channel transistor 240.

The identical currents from transistors 410 and 420 ensure that the drain currents of N-channel transistors 430 and 440 are also identical. As noted above, transistor 440 has a W/L ratio that is larger than the W/L ratio of transistor 430 by the multiplicative factor, z. For z>1, it can be shown that the current, I(y), depends on the resistance value (R450) of resistor 450 and the channel mobility ($\mu_n$) such that:

$$I \alpha 1/[(R450)^2(\mu_n)],$$

where $\alpha$ is an operator meaning "is proportional to".

The current, I(y), also depends on W/L, $C_{ox}$, and z, which are constant with respect to temperature. The resistance value (R450) of resistor 450 has a positive temperature coefficient and the channel mobility ($\mu_n$) has a negative temperature coefficient, such that:

$R \alpha T$; and $\mu_n \alpha T^{-3/2}$.

Therefore, the output current, I(y), has a weak negative temperature coefficient. In practice, this current can be chosen in the design so as to offset the increase due to the +ve temperature coefficient current in the temperature range of interest.

If P-channel transistor 320 has the dimension ratio (W1/L1) and generates the current I(x), then P-channel transistor 230 has the dimension ratio (mW1/L1) in order to generate the current mI(x). Similarly, if P-channel transistor 420 has the dimension ratio (W2/L2) and generates the current I(y), then P-channel transistor 240 has the dimension ratio (nW1/L1) in order to generate the current nI(y). The values of the multiplying factors m and n are determined by the proportion of I(x) and I(y) required to nullify the temperature dependency of the output current, I(out).

This process makes the design simpler in the sense that a circuit designer only needs to make sure that the currents are added in the correct proportion to make the output current independent of temperature. In actual implementation, these current mirrors are cascode current mirrors to minimize the variation due to supply voltage.

Additionally, positive temperature coefficient current generator 210 and negative temperature coefficient current generator 220 both have two operating points. One operating point is trivial—zero current flows even when the supply has built up to a nominal value. Therefore, a start-up circuit (not shown) ensures that positive temperature coefficient current generator 210 and negative temperature coefficient current generator 220 both reaches the desired operating point when the VDD power supply is applied.

Although the present invention has been described with an exemplary embodiment, various changes and modifications may be suggested to one skilled in the art. It is intended that the present invention encompass such changes and modifications as fall within the scope of the appended claims.

What is claimed is:

1. A constant current source for generating a constant reference current that is relatively temperature insensitive, said constant current source comprising:

first circuitry for generating a first output current that increases with increases in temperature;

second circuitry for generating a second output current that decreases with increases in temperature; and a current combiner circuit that receives said first and second output currents at a common connection and combines said first and second output currents to thereby generate said constant reference current, wherein a change in said first output current caused by a temperature change is at least partially offset by a change in said second output current caused by said temperature change.

2. The reference current generator as set forth in claim 1 wherein said first circuitry comprises a first reference current generator for generating a first reference current that increases with increases in temperature.

3. The reference current generator as set forth in claim 2 wherein said first circuitry further comprises a first current mirror circuit capable of multiplying said first reference current by a factor m to thereby generate said first output current that increases with increases in temperature.

4. The reference current generator as set forth in claim 3 wherein said second circuitry comprises a second reference current generator for generating a second reference current that decreases with increases in temperature.

5. The reference current generator as set forth in claim 4 wherein said second circuitry further comprises a second current mirror circuit capable of multiplying said second reference current by a factor n to thereby generate said second output current that decreases with increases in temperature.

6. The reference current generator as set forth in claim 5 wherein said factor m and said factor n are determined based on the relative proportions of the first and second reference currents.

7. The reference current generator as set forth in claim 6 wherein said factor m and said factor n are selected according to the relative proportions of the first and second reference currents required to negate the temperature dependency of the constant reference current.

8. The reference current generator as set forth in claim 7 wherein said first and second current mirror circuits comprise P-channel transistors.

9. A cellular telephone comprising:

a voltage regulator capable of receiving a supply voltage from a battery of said cellular telephone and generating a regulated output voltage;

analog-to-digital circuitry capable of converting analog signal in said cellular telephone to digital signals; and a constant current source capable of supplying a constant reference current to said voltage regulator and said analog-to-digital circuitry, wherein said constant reference current is relatively temperature insensitive, said constant current source comprising:

first circuitry for generating a first output current that increases with increases in temperature;

second circuitry for generating a second output current that decreases with increases in temperature; and a current combiner circuit that receives said first and second output currents at a common connection and combines said first and second output currents to thereby generate said constant reference current, wherein a change in said first output current caused by a temperature change is at least partially offset by a change in said second output current caused by said temperature change.

10. The cellular telephone as set forth in claim 9 wherein said first circuitry comprises a first reference current generator for generating a first reference current that increases with increases in temperature.

11. The cellular telephone as set forth in claim 10 wherein said first circuitry further comprises a first current mirror circuit capable of multiplying said first reference current by a factor m to thereby generate said first output current that increases with increases in temperature.

12. The cellular telephone as set forth in claim 11 wherein said second circuitry comprises a second reference current generator for generating a second reference current that decreases with increases in temperature.

13. The cellular telephone as set forth in claim 12 wherein said second circuitry further comprises a second current mirror circuit capable of multiplying said second reference current by a factor n to thereby generate said second output current that decreases with increases in temperature.

14. The cellular telephone as set forth in claim 13 wherein said factor m and said factor n are determined based on the relative proportions of the first and second reference currents.

15. The cellular telephone as set forth in claim 14 wherein said factor m and said factor n are selected according to the relative proportions of the first and second reference currents required to negate the temperature dependency of the constant reference current.

16. The cellular telephone as set forth in claim 9 wherein said first and second current mirror circuits comprise P-channel transistors.

17. A method of generating a constant reference current that is relatively temperature insensitive, the method comprising the steps of:

generating a first output current that increases with increases in temperature;

generating a second output current that decreases with increases in temperature; and combining the first and second output currents at a common connection to thereby generate the constant reference current, wherein a change in the first output current caused by a temperature change is at least partially offset by a change in the second output current caused by the temperature change.

18. The method of generating a constant reference current as set forth in claim 17 further comprising the steps of:

generating a first reference current that increases with increases in temperature; and multiplying the first reference current by a factor m to thereby generate the first output current that increases with increases in temperature.

19. The method of generating a constant reference current as set forth in claim 18 further comprising the steps of:

generating a second reference current that decreases with increases in temperature; and multiplying the second reference current by a factor n to thereby generate the second output current that decreases with increases in temperature.

20. The method of generating a constant reference current as set forth in claim 18 wherein the factor m and the factor n are determined based on the relative proportions of the first and second reference currents.

* * * * *